United States Patent
Kobayashi et al.

(10) Patent No.: US 10,115,731 B2
(45) Date of Patent: Oct. 30, 2018

(54) SEMICONDUCTOR MEMORY DEVICE

(71) Applicant: Toshiba Memory Corporation, Minato-ku (JP)

(72) Inventors: Shigeki Kobayashi, Kuwana (JP); Takamasa Okawa, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 1 day.

(21) Appl. No.: 15/700,393

(22) Filed: Sep. 11, 2017

(65) Prior Publication Data

US 2018/0261614 A1    Sep. 13, 2018

Related U.S. Application Data

(60) Provisional application No. 62/470,377, filed on Mar. 13, 2017.

(51) Int. Cl.
| | |
|---|---|
| *H01L 29/04* | (2006.01) |
| *H01L 31/036* | (2006.01) |
| *H01L 27/11556* | (2017.01) |
| *H01L 27/11582* | (2017.01) |

(52) U.S. Cl.
CPC .. *H01L 27/11556* (2013.01); *H01L 27/11582* (2013.01)

(58) Field of Classification Search
None
See application file for complete search history.

(56) References Cited

U.S. PATENT DOCUMENTS

| 7,936,004 B2 | 5/2011 | Kito et al. | |
|---|---|---|---|
| 2017/0263631 A1* | 9/2017 | Fujiki | H01L 21/4846 |
| 2017/0263636 A1* | 9/2017 | Ishida | H01L 27/11582 |

* cited by examiner

*Primary Examiner* — Thien F Tran
(74) *Attorney, Agent, or Firm* — Oblon, McClelland, Maier & Neustadt, L.L.P.

(57) ABSTRACT

A semiconductor memory device includes an interconnect layer including a conductive layer and a semiconductor layer of a first conductivity type provided on the conductive layer; a stacked body including a plurality of electrode layers stacked on the interconnect layer, a semiconductor pillar provided in the stacked body and extending through the plurality of electrode layers in a stacking direction thereof; and an insulating layer provided on the interconnect layer and extending along a lateral surface of the stacked body. The semiconductor layer includes a first semiconductor region of a second conductivity type positioned between the insulating layer and the conductive layer, and the first semiconductor region is in contact with the conductive layer.

15 Claims, 9 Drawing Sheets

SEMICONDUCTOR MEMORY DEVICE

CROSS-REFERENCE TO RELATED APPLICATIONS

This application is based upon and claims the benefit of priority from U.S. Provisional Patent Application 62/470,377 filed on Mar. 13, 2017; the entire contents of which are incorporated herein by reference.

FIELD

Embodiments are generally related to a semiconductor memory device.

BACKGROUND

A semiconductor memory device is under developing, which includes three-dimensionally arranged memory cells. For example, a NAND type memory device includes a plurality of word lines stacked on a source line and a semiconductor pillar extending therethrough, and the memory cells are disposed at parts where the semiconductor pillar crosses the respective word lines. The semiconductor pillar is electrically connected to the source line, and the memory cells are driven by a bias applied to the semiconductor pillar via the source line and biases applied to the respective word lines. In the memory device having such a structure, for example, when the electric resistance along the current path in the source line, which leads to the semiconductor pillar, is large, some drawbacks may be arisen such as reduction of the ON current for reading data out from the memory cells.

DETAILED DESCRIPTION

Figure 1:
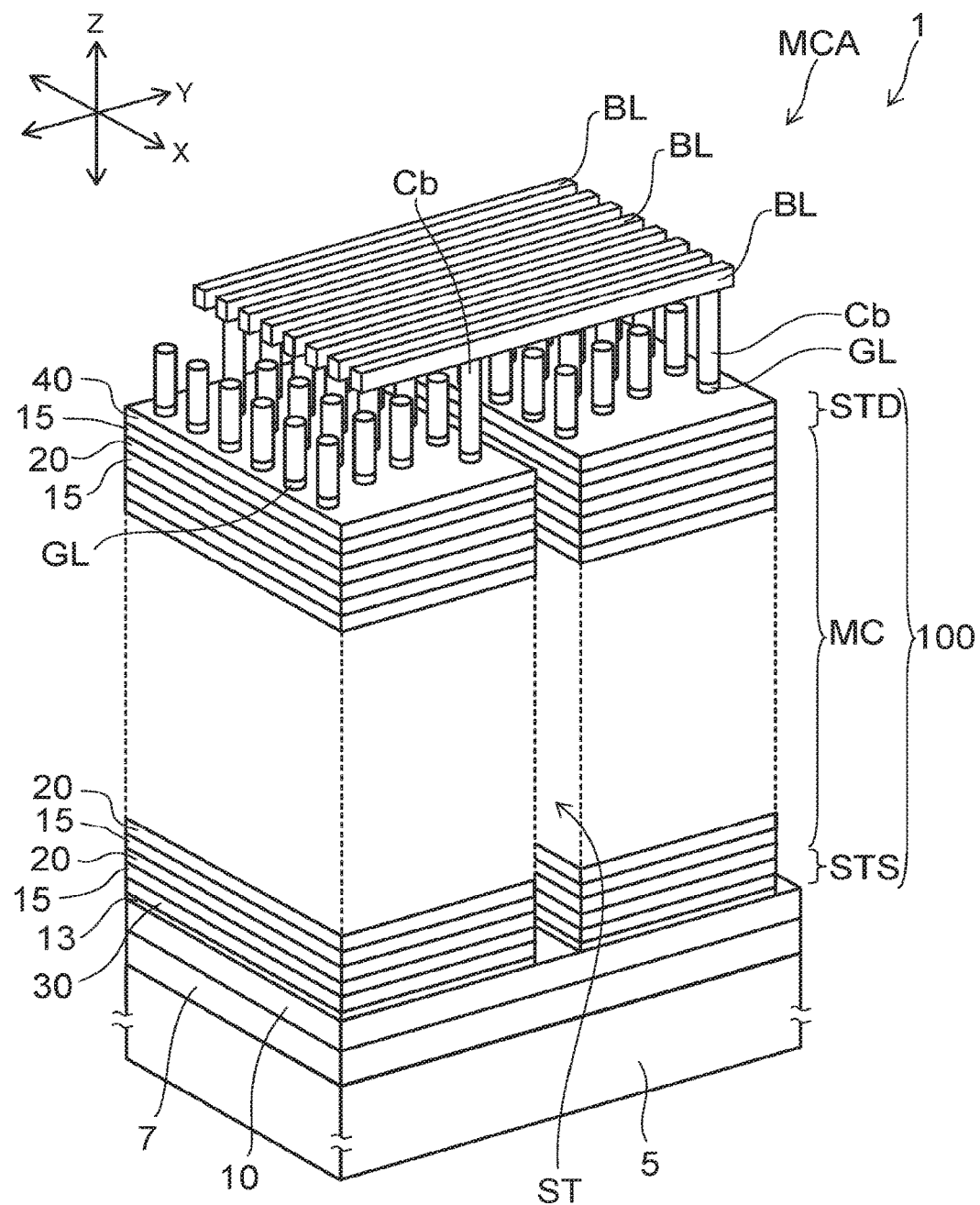
FIG. 1 is a perspective view schematically showing a semiconductor memory device according to an embodiment.

According to one embodiment, a semiconductor memory device includes an interconnect layer including a conductive layer and a semiconductor layer of a first conductivity type provided on the conductive layer; a stacked body including a plurality of electrode layers stacked on the interconnect layer, a semiconductor pillar provided in the stacked body and extending through the plurality of electrode layers in a stacking direction thereof; and an insulating layer provided on the interconnect layer and extending along a lateral surface of the stacked body. The semiconductor layer includes a first semiconductor region of a second conductivity type positioned between the insulating layer and the conductive layer, and the first semiconductor region is in contact with the conductive layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a perspective view schematically showing a memory cell array MCA of a semiconductor memory device 1 according to a first embodiment. The semiconductor memory device 1 is, for example, a NAND type memory device, and includes three-dimensionally arranged memory cells.

As shown in FIG. 1, a semiconductor memory device 1 includes an interconnect layer (hereinafter referred to as a source line 10) provided on a substrate 5 and a stacked body 100. The source line 10 is provided on the substrate 5 with the interlayer insulating layer 7 interposed. The stacked body 100 includes a plurality of electrode layers (hereinafter, word lines 20, selection gates 30 and 40) stacked in the Z direction. A plurality of stacked bodies 100 are arranged, for example, in the Y direction on the source line 10. The adjacent stacked bodies 100 in the Y direction are separated from each other by a slit space ST.

The selection gate 30 is provided on the source line 10 via the insulating layer 13. The word line 20 is stacked on the selection gate 30. The insulating layer 15 is provided between the selection gate 30 and the lowermost word line 20 and between the adjacent word lines 20 in the Z direction. The selection gate 40 is provided on the uppermost word line 20 via another insulating layer 15.

The substrate 5 is, for example, a silicon substrate. The source line 10 includes, for example, a metal layer and a polycrystalline silicon layer provided thereon, and is provided with a plate shape extending in the X direction and the Y direction. The word lines 20 and the selection gates 30 and 40 are, for example, tungsten layers. The interlayer insulating layer 7 and the insulating layers 13 and 15 are, for example, silicon oxide layers. The semiconductor memory device 1 may include a circuit for driving the memory cells MC between the substrate 5 and the interlayer insulating layer 7.

The stacked body 100 includes a plurality of columnar bodies CL extending through the word lines 20, the selection gates 30 and 40 in the Z direction. The respective columnar bodies include a semiconductor pillar 50 (see FIG. 2A). The semiconductor pillars 50 are electrically connected to the bit lines BL via contact plugs Cb, respectively. It should be noted that an interlayer insulating layer provided between the selection gate 40 and the bit lines BL and an insulating layer 17 provided inside the slit space ST (see FIG. 2A) are omitted in FIG. 1 for convenience in showing the structure of the semiconductor memory device 1.

The bit line BL extends, for example, in the Y direction above the stacked bodies 100. One of the semiconductor pillars 50 provided in the stacked body 100 and one of the semiconductor pillars 50 provided in another stacked body 100 can share one bit line BL.

Figure 2A:
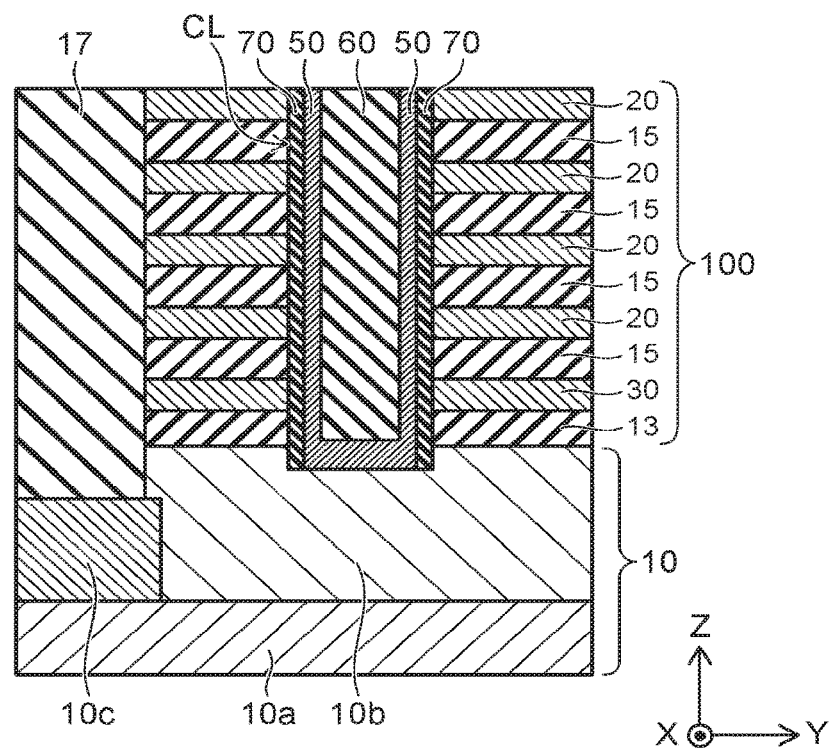
FIGS. 2A and 2B are a schematic cross-sectional view and a plan view showing the semiconductor memory device according to the embodiment.
Figure 2B:
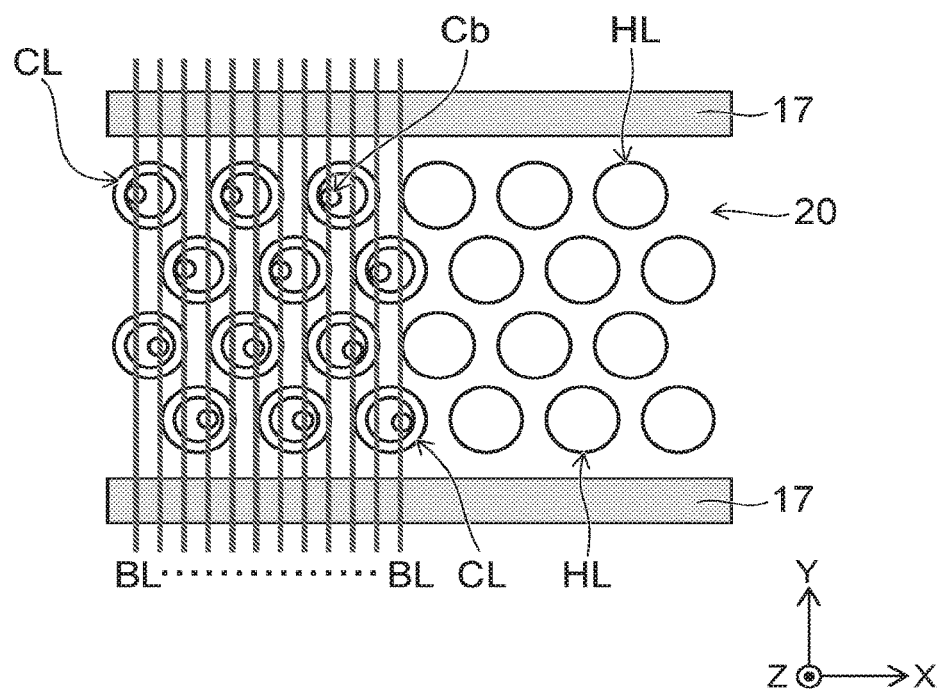

FIGS. 2A and 2B are schematic views showing the semiconductor memory device 1. FIG. 2A is a schematic diagram showing a partial cross section of the memory cell array MCA. FIG. 2B is a plan view schematically showing the top surface of the memory cell array MCA.

As shown in FIG. 2A, the source line 10 includes a conductive layer 10a and a semiconductor layer 10b. The conductive layer 10a is, for example, a metal layer of tungsten or the like, and is provided on the interlayer insulating layer 7. The semiconductor layer 10b is, for example, a P-type polycrystalline silicon layer deposited on the conductive layer 10a using CVD. It should be noted that the conductive layer 10a is, for example, a metal layer having a lower resistivity than a resistivity of the semiconductor layer 10b. The conductive layer 10a may be, for example, a metal silicide layer or may include a metal silicide at a portion in contact with the semiconductor layer 10b.

Moreover, the semiconductor layer 10b includes a semiconductor region 10c provided in a portion located between the conductive layer 10a and the insulating layer 17. The semiconductor region 10c is, for example, an N-type region and contains N-type impurities at a higher concentration than the P-type impurities contained in the semiconductor layer 10b. For example, the concentration of the P-type impurities is $1 \times 10^{15}$ cm$^{-3}$ or less; and the concentration of the N type impurities is $1 \times 10^{18}$ cm$^{-3}$ or more. The insulating layer 17 is, for example, a silicon oxide layer buried in the inside of the slit space ST (see FIG. 1), and extends along a lateral surface of the stacked body 100.

The stacked body 100 is provided on the semiconductor layer 10b and includes a columnar bodies CL extending through the word lines 20 and the selection gate 30 in the Z direction. Moreover, the columnar bodies CL extend through the selection gate 40 in a part not shown.

A columnar body CL includes a semiconductor pillar 50, an insulating core 60, and an insulating layer 70. The insulating core 60 is a columnar insulator extending in the Z direction inside the columnar body CL. The semiconductor pillar 50 is provided with a columnar shape surrounding the lateral surface of the insulating core 60, and extends in the Z direction along the insulating core 60. The semiconductor pillar 50 is electrically connected to the semiconductor layer 10b at the bottom end thereof.

The insulating layer 70 is positioned between the word line 20 and the semiconductor pillar 50, and between the selection gate 30 and the semiconductor pillar 50. The insulating layer 70 extends in the Z direction along the semiconductor pillar 50. The insulating layer 70 has a stacked structure including, for example, a blocking insulator film, a charge storage film and a tunneling insulator film stacked in order from the word line 20 side. The insulating layer 70 acts, for example, as a charge storage portion of the memory cell MC in a part positioned between the word line 20 and the semiconductor pillar 50.

The memory cell MC is provided at a part where the semiconductor pillar 50 crosses the word line 20. Further, a source-side selection transistor STS is provided in a part where the semiconductor pillar 50 crosses the selection gate 30 (see FIG. 1). A drain side selection transistor STD is provided in a part where the semiconductor pillar 50 crosses the selection gate 40 (see FIG. 1).

As shown in FIG. 2B, a plurality of columnar bodies CL are disposed between two insulating layers 17 extending in the X direction. Further, bit lines BL are provided on the plurality of columnar bodies CL. A bit lines BL is connected to one columnar body CL via the contact plug Cb. Further, a plurality of columnar bodies HL not connected to the bit line BL are disposed between the two insulating layers 17. The columnar bodies HL are provided to support the insulating layers 15 in a removal process of the sacrificial layers 25 which will be described later (see FIG. 4F).

Figure 3:
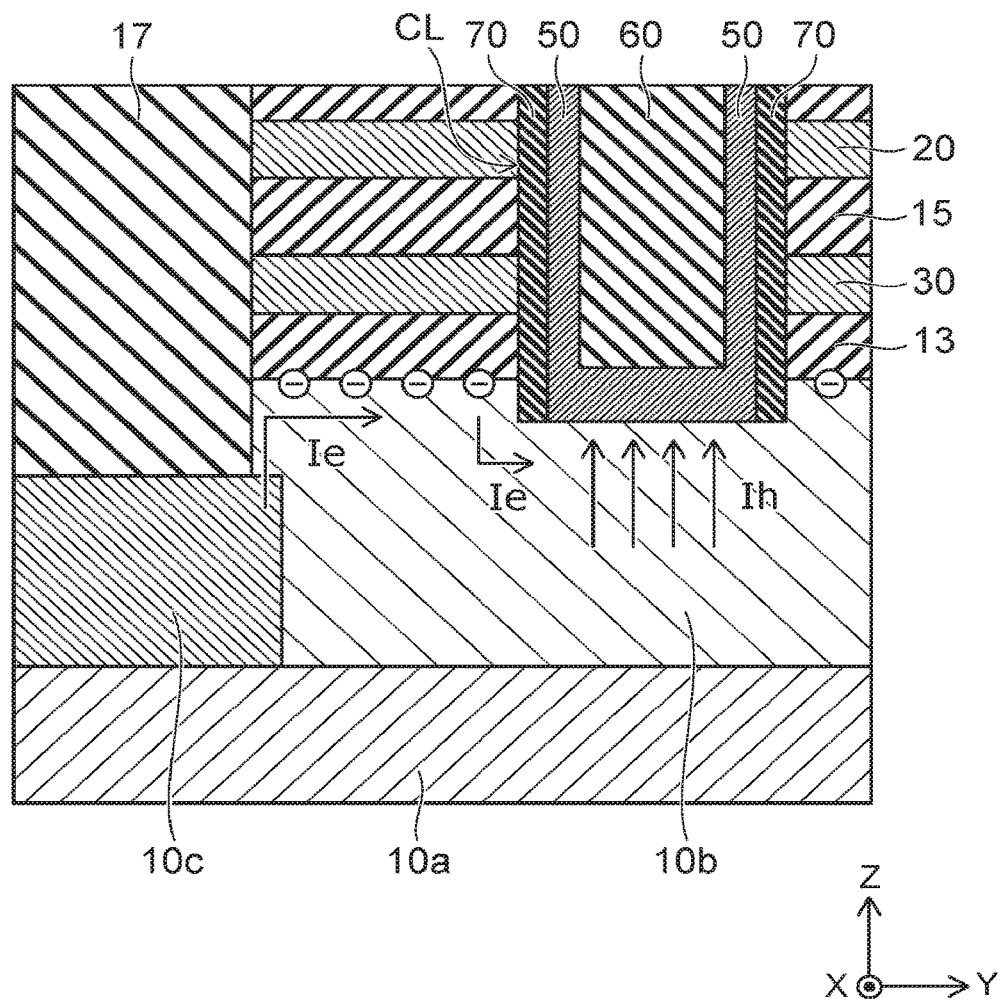
FIG. 3 is a schematic cross-sectional view showing a behavior of the semiconductor memory device according to the embodiment.

FIG. 3 is a schematic cross-sectional view showing the behavior of the semiconductor memory device 1 according to the embodiment. FIG. 3 is a partial cross-sectional view showing the bottom part of the columnar body CL and the semiconductor region 10c.

For example, when erasing data stored in the memory cell MC, it is possible to erase the data efficiently by injecting a hole current Ih into the semiconductor pillar 50. For this purpose, the semiconductor layer 10b is preferably P-type.

In contrast, when reading data out from the memory cell MC, for example, the ON current flows from the source line 10 to the bit line BL through the semiconductor pillar 50. At this time, the selection transistor STS is turned on by the bias applied to the selection gate 30, and an inversion layer is induced at the interface between the semiconductor layer 10b and the insulating layer 13. As shown in FIG. 3, the ON current is, for example, an electron current Ie, which flows from the conductive layer 10a through the semiconductor region 10c, and flows into the semiconductor pillar via the inversion layer. In this case, it is possible to reduce the resistance value for the electron current Ie by providing a path flowing from the conductive layer 10a through the N-type semiconductor region 10c to the inversion layer, comparing with a path from the conductive layer 10a to the semiconductor pillar 50 through the semiconductor layer 10b. Thereby, it is possible to increase the ON current when reading data out from the memory cell MC.

A method of manufacturing the semiconductor memory device 1 according to the embodiment will be described below with reference to FIGS. 4A to 4H. FIGS. 4A to 4H are schematic cross-sectional views showing a manufacturing process of the semiconductor memory device 1.

Figure 4A:
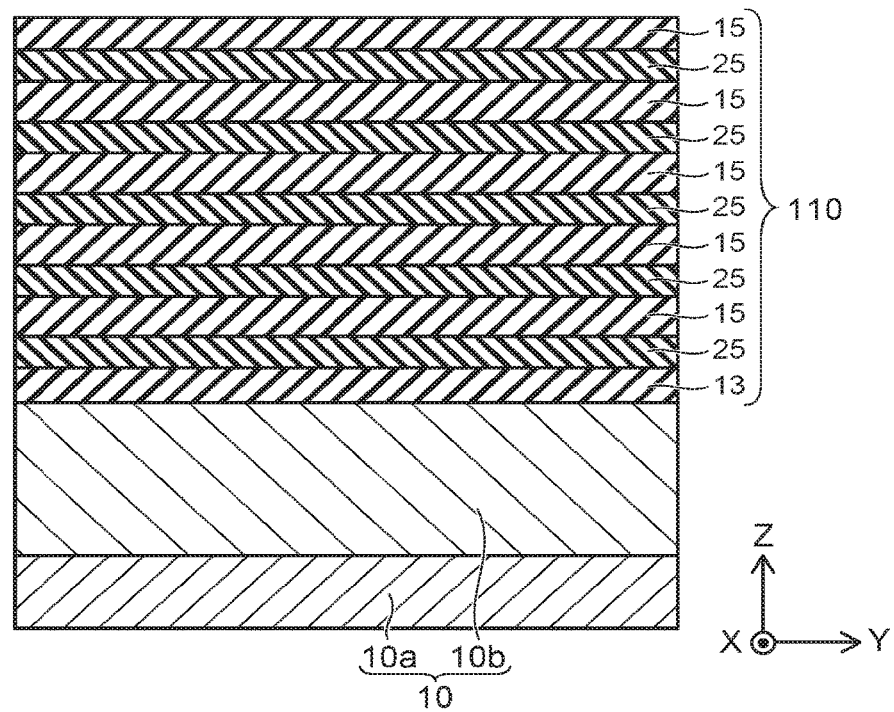
FIGS. 4A to 4H are schematic cross-sectional views showing a manufacturing process of the semiconductor memory device according to the embodiment.

As shown in FIG. 4A, the stacked body 110 is formed on the source line 10. The source line 10 includes a conductive layer 10a and a semiconductor layer 10b. The stacked body 110 includes insulating layers 13 and 15 and sacrificial layers 25. The insulating layer 13 is formed on the semiconductor layer 10b, and the insulating layers 15 and the sacrificial layers 25 are alternately stacked on the insulating layer 13. The insulating layers 13 and 15 are, for example, silicon oxide layers deposited using CVD (Chemical Vapor Deposition), and the sacrificial layers 25 are, for example, silicon nitride layers deposited using CVD.

Figure 4B:
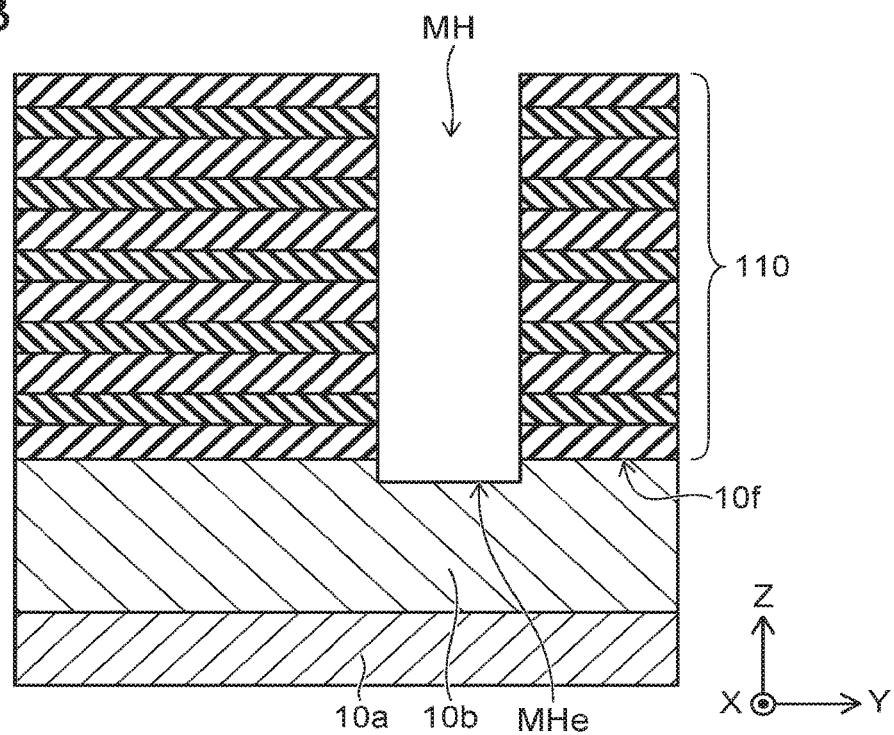

As shown in FIG. 4B, a memory hole MH is formed with a depth from the top surface of the stacked body 110 to the semiconductor layer 10b. The memory hole MH is formed, for example, by selectively removing the insulating layers 13 and 15 and the sacrificial layers 25 using anisotropic RIE (Reactive Ion Etching). In the process of forming the memory hole MH, the semiconductor layer 10b is also etched, and the bottom end MHe of the memory hole MH is positioned at a level lower than the top surface 10f of the semiconductor layer 10b.

Figure 4C:
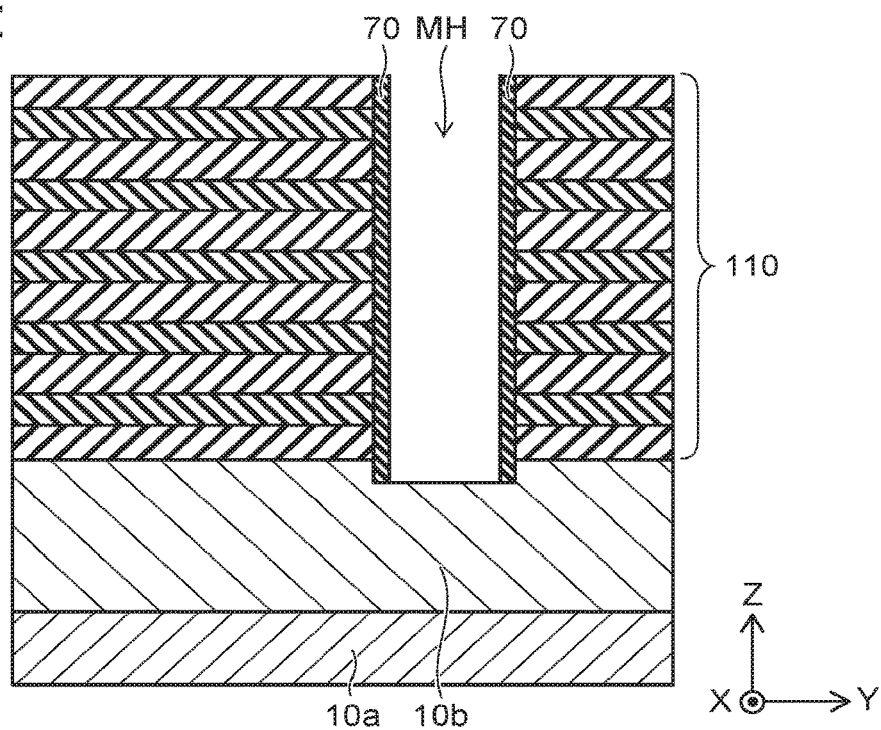

As shown in FIG. 4C, the insulating layer 70 is formed on an inner wall of the memory hole MH. The insulating layer 70 has, for example, an ONO structure in which a silicon oxide layer, a silicon nitride layer, and a silicon oxide layer are stacked in order on the inner wall of the memory hole MH. The insulating layer 70 is formed using ALD (Atomic Layer Deposition), for example. At this time, a part of the insulating layer 70 formed on the bottom surface of the memory hole MH is selectively removed, for example, by anisotropic RIE.

Figure 4D:
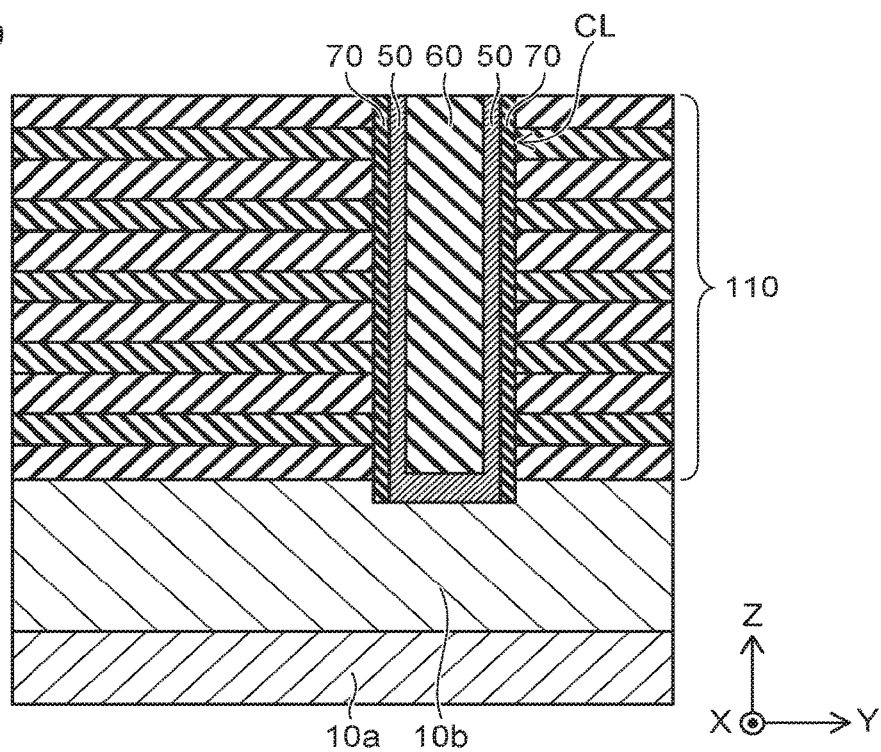

As shown in FIG. 4D, a semiconductor pillar 50 and an insulating core 60 are formed in the memory hole MH. The semiconductor pillar 50 is, for example, an undoped polycrystalline silicon layer formed using CVD. The insulating core 60 is, for example, silicon oxide deposited by CVD, and is formed so as to fill the memory hole MH.

Figure 4E:
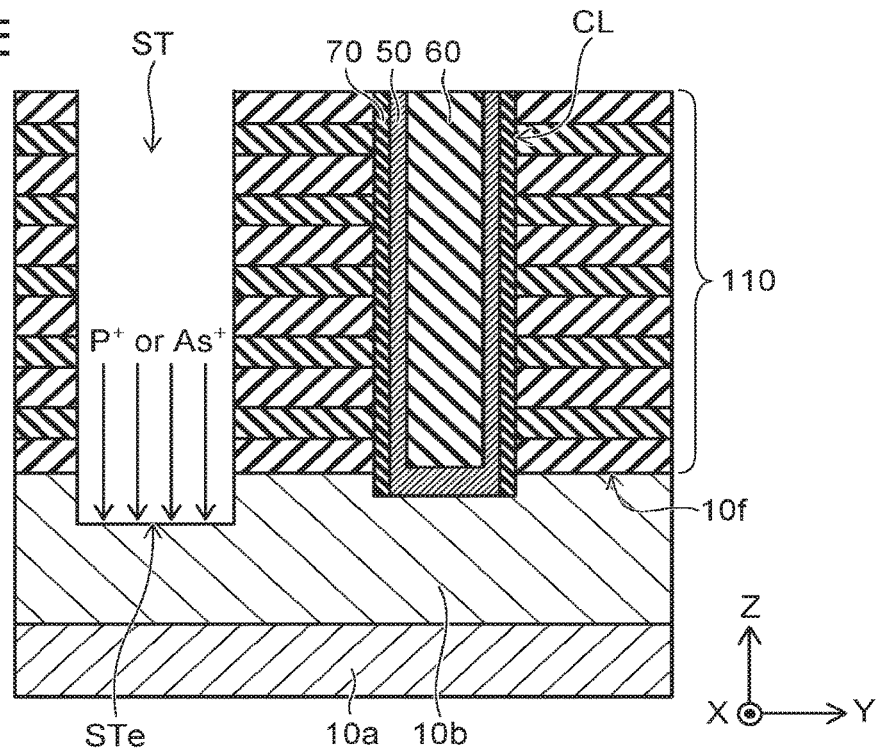

As shown in FIG. 4E, a slit space ST is formed with a depth from the top surface of the stacked body 110 to the semiconductor layer 10b. The slit space ST extends also in the X direction, for example, and divides the stacked body 110 into a plurality of parts. The slit space ST is formed, for example, by using anisotropic RIE, and the bottom end STe thereof is positioned at a level lower than the top surface 10f of the semiconductor layer 10b. Subsequently, for example, phosphorus (P) or arsenic (As), which is an N type impurity, is ion-implanted into the semiconductor layer 10b through the memory hole MH.

Figure 4F:
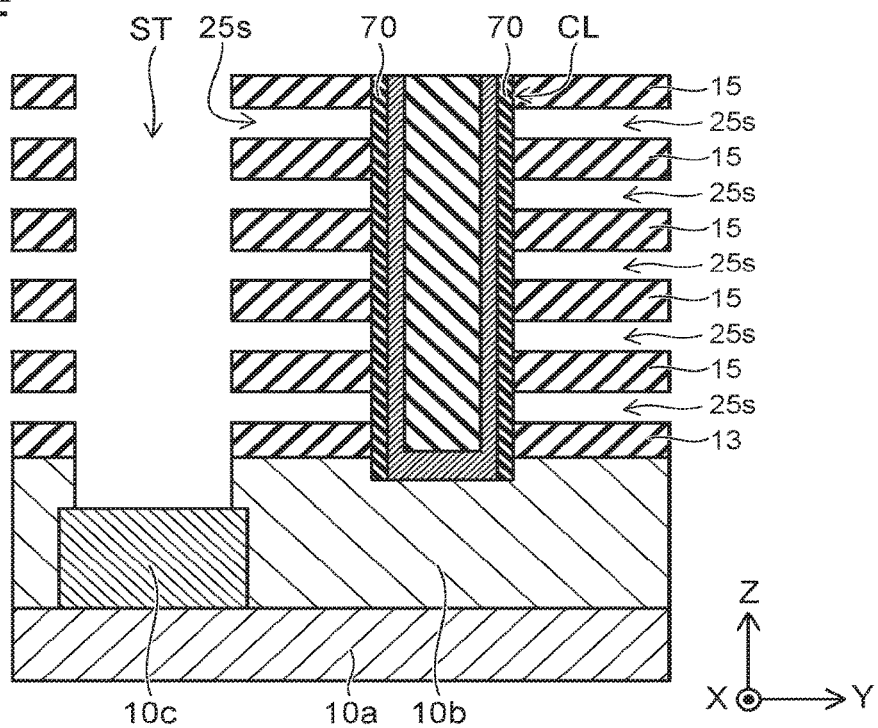

As shown in FIG. 4F, the semiconductor region 10c is formed by activating the impurities ion-implanted into the semiconductor layer 10b. An N-type semiconductor region is formed, for example, by heat-treating the source line 10 under predetermined conditions for activating the N-type impurities ion-implanted into the semiconductor layer 10b.

Subsequently, the sacrificial layer 25 is selectively removed via the slit space ST, thereby forming a space 25s. The sacrificial layer 25 is removed, for example, by wet etching using an etching solution supplied through the slit space ST. In the case where the sacrificial layers 25 are silicon nitride layers, for example, it is possible to selectively remove the sacrificial layers 25 by supplying hot phosphoric acid as an etching liquid without etching the insulating layers 13, 15 and the semiconductor layer 10b.

Figure 4G:
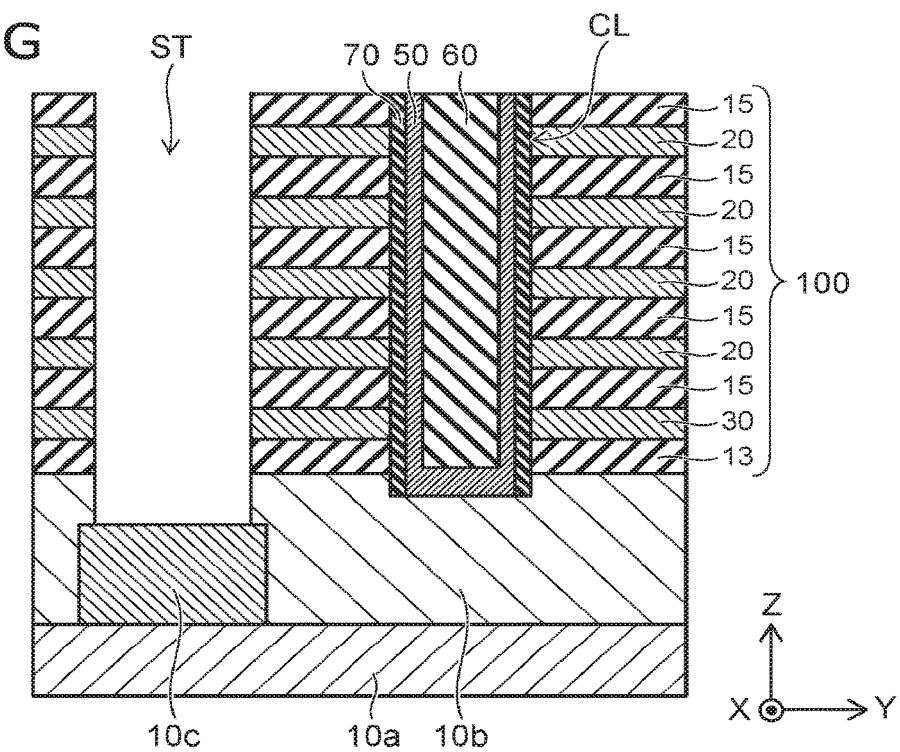

As shown in FIG. 4G, word lines 20 and a selection gate 30 are formed in the spaces 25s. A selection gate 40 is also formed at the same time in a portion not shown. The word lines 20 and the selection gate 30 are formed, for example, by depositing a metal layer in spaces 25s using CVD. At this time, a part of the metal layer deposited on the inner surface of the slit space ST is removed, for example, using isotropic dry etching.

Figure 4H:
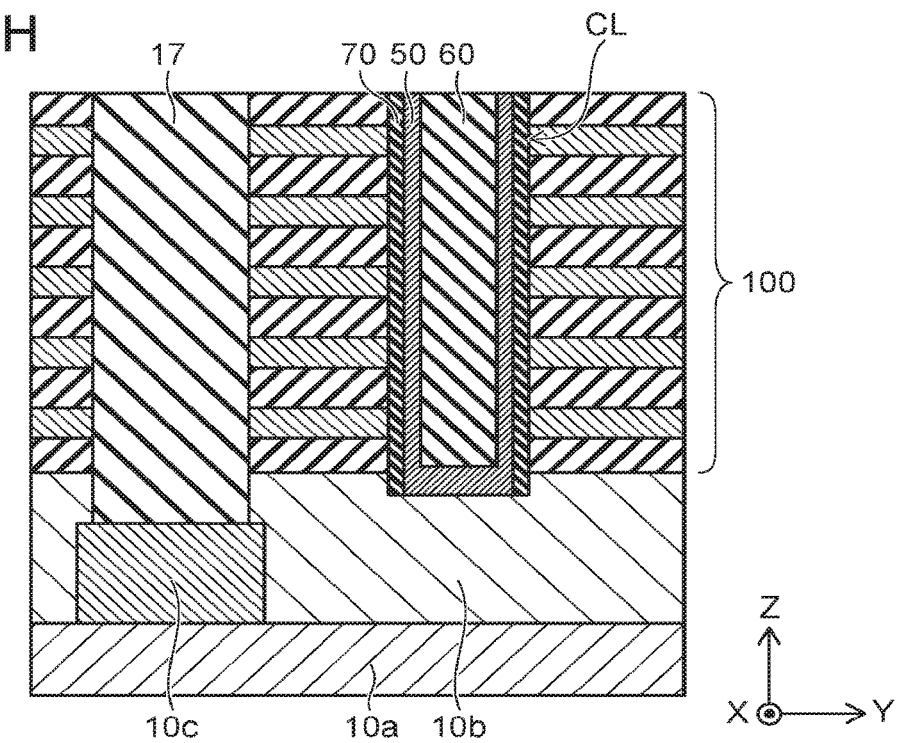

As shown in FIG. 4H, the insulating layer 17 is formed in the slit space ST, and the memory cell array MCA is completed. The insulating layer 17 is, for example, a silicon oxide layer formed using CVD.

In the embodiment, it is possible to reduce the resistance for the ON current by forming the semiconductor region 10c in the part of the semiconductor layer 10b between the conductive layer 10a and the insulating layer 17. Thus, the semiconductor layer 10b can be formed thicker comparing with a case where the semiconductor region 10c is not formed. As a result, the requirements for controlling the positions of bottom ends MHe and SLe are mitigated in the process of forming the memory hole MH and the slit space ST.

For example, in a pathway of electron current where the semiconductor region 10c is not provided, it is desirable to reduce the thickness of the semiconductor layer 10b in order to reduce the electric resistance for the ON current. In contrast, the bottom end MHe of the memory hole MH and the bottom end SLe of the slit space ST are preferably positioned in the semiconductor layer 10b. When the bottom end MHe of the memory hole MH and the bottom end SLe of the slit space ST are positioned in the conductive layer 10a, resulting in a direct contact of the conductive layer 10a and semiconductor pillar 50, the contact resistance is increased due to a metal-semiconductor layer contact with a small contact area and a low impurity concentration of the semiconductor layer. Moreover, there is a disadvantage that hole-injections into the semiconductor pillar 50 from the source line side become difficult when erasing data. Thus, it is preferable to increase the thickness of the semiconductor layer 10b in view of the manufacturing process in which the bottom end MHe of the memory hole MH and the bottom end SLe of the slit space ST are controlled to be positioned in the semiconductor layer 10b. As described above, there are contradictory requirements for the thickness of semiconductor layer 10b. In the embodiment, the requirements for controlling the positions of the bottom end MHe of the memory hole MH and the bottom end SLe of the slit space ST is possible to be mitigated by forming the semiconductor region 10c, while suppressing the increase in the electrical resistance for the ON current.

Figure 6:
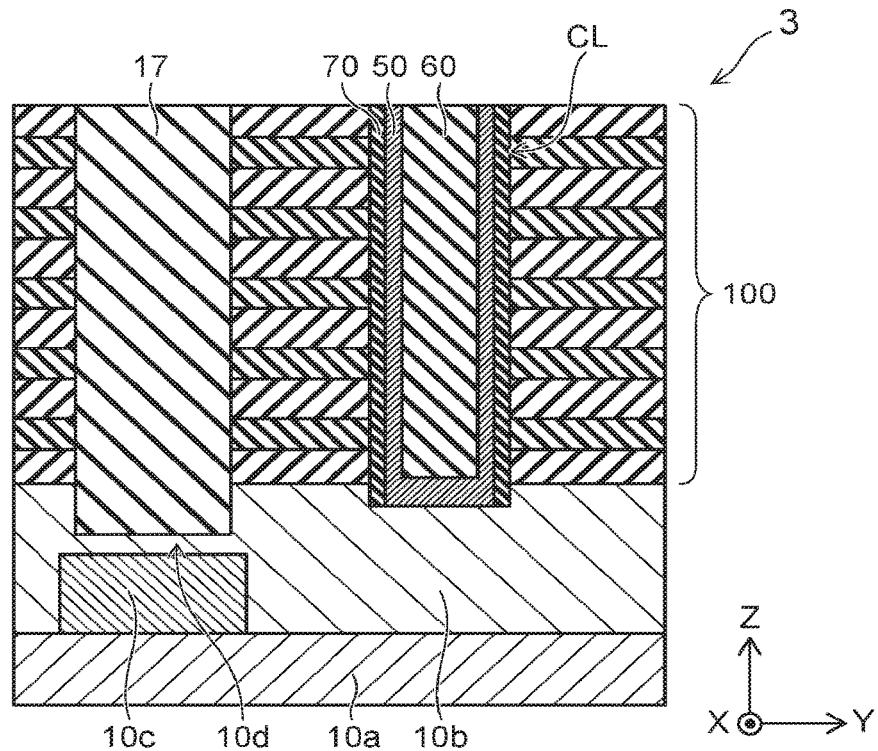
Figure 7:
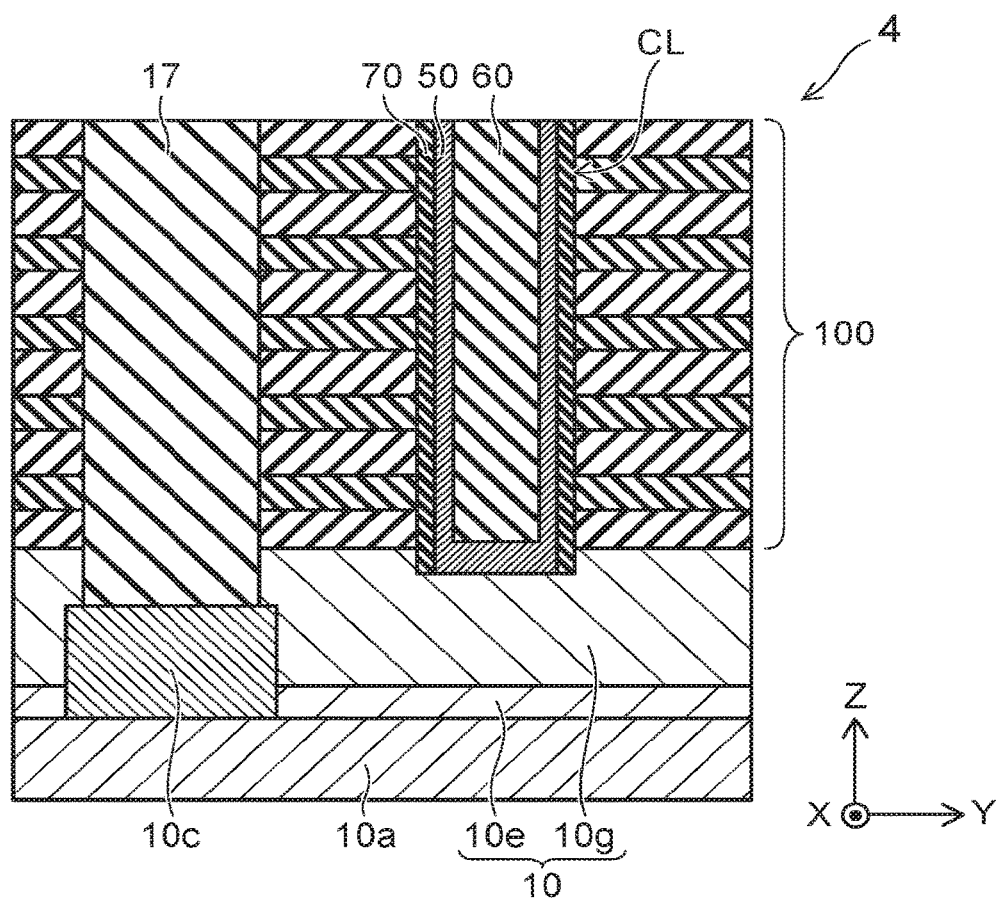

A semiconductor memory device according to a variation of the embodiment will be described below with reference to FIG. 5 to FIG. 7. FIGS. 6 to 7 are schematic cross-sectional views showing the semiconductor memory devices 2 to 4 according to the variation.

Figure 5:
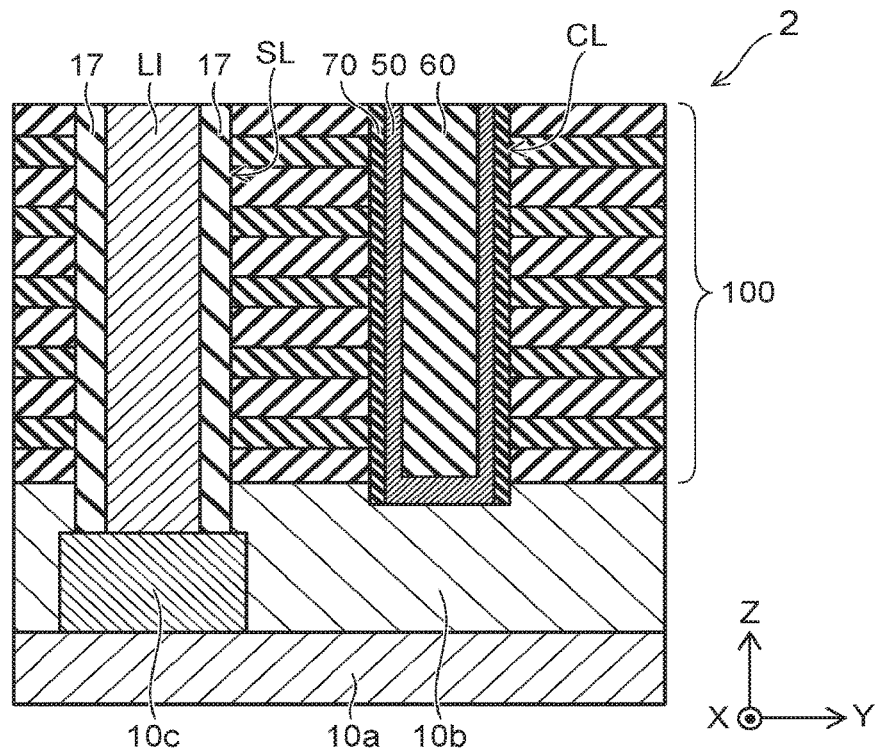
FIGS. 5 to 7 are schematic cross-sectional views showing a semiconductor memory device according to a variation of the embodiment.

The semiconductor memory device 2 shown in FIG. 5 includes a contact body LI provided in the slit space ST. The contact body LI is a conductor provided in the slit space ST, and is electrically connected to the semiconductor region 10c at the bottom end thereof. The contact body LI is, for example, a plate-like metal layer extending in the Z direction and the X direction, and is electrically insulated from the word lines 20 and the selection gate 30 by an insulating layer 17 covering the lateral surface of the stacked body 100.

In this example, it is possible to uniform the bias supplied to the semiconductor layer 10b by providing the contact body LI. For example, in a case where a voltage drop is induced due to the electric resistance of the conductive layer 10, it is possible to make the bias uniform in the semiconductor layer 10b by simultaneously supplying the bias through the contact body LI.

The semiconductor memory device 3 shown in FIG. 6 has a semiconductor region 10d between the semiconductor region 10c and the insulating layer 17. The semiconductor region 10d has a conductivity type opposite to that of the semiconductor region 10c, which is, for example, a P-type semiconductor region. The semiconductor region 10d electrically connects the P-type semiconductor regions divided by the semiconductor region 10c, for example, in the Y direction. Thereby, holes supplied to the semiconductor layer 10b can be made uniform in the data erasing operation. The semiconductor region 10d can be formed, for example, by ion-implanting P-type impurities in addition to the ion-implantation of N-type impurities shown in FIG. 4E.

In the semiconductor memory device 4 shown in FIG. 7, the semiconductor layer 10b includes a first layer 10e and a second layer 10g. The first layer 10e is positioned between the conductive layer 10a and the second layer 10g, and is provided to be in contact with the conductive layer 10a. The first layer 10e contains, for example, P-type impurities with a concentration higher than that in the second layer 10g, and supplies holes to the second layer 10g when erasing data. Thereby, it is possible to make the distribution of holes uniform in the semiconductor layer 10b.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device comprising:
   an interconnect layer including a conductive layer and a semiconductor layer of a first conductivity type provided on the conductive layer;
   a stacked body including a plurality of electrode layers stacked on the interconnect layer,
   a semiconductor pillar provided in the stacked body and extending through the plurality of electrode layers in a stacking direction thereof; and
   an insulating layer provided on the interconnect layer and extending along a lateral surface of the stacked body,
   the semiconductor layer including a first semiconductor region of a second conductivity type positioned between the insulating layer and the conductive layer, and the first semiconductor region being in contact with the conductive layer.

2. The semiconductor memory device according to claim 1, wherein the conductive layer is a metal layer having a lower resistivity than a resistivity of the semiconductor layer.

3. The semiconductor memory device according to claim 1, wherein the semiconductor layer includes silicon, and the conductive layer includes a metal silicide.

4. The semiconductor memory device according to claim 1, wherein the semiconductor layer includes a P-type impurity; and the first semiconductor region includes an N-type impurity having a concentration higher than a concentration of the P-type impurity.

5. The semiconductor memory device according to claim 4, wherein the concentration of the P-type impurity is $1\times10^{15}$ cm$^{-3}$ or less; and the concentration of the N type impurity is $1\times10^{18}$ cm$^{-3}$ or more.

6. The semiconductor memory device according to claim 1, wherein the semiconductor pillar is electrically connected to the interconnect layer.

7. The semiconductor memory device according to claim 1, wherein the semiconductor layer and the semiconductor pillar include polycrystalline silicon.

8. The semiconductor memory device according to claim 1, wherein a bottom end of the semiconductor pillar is positioned at a level lower than a top surface of the semiconductor layer, and the bottom end of the semiconductor pillar is positioned above a top surface of the conductive layer.

9. The semiconductor memory device according to claim 1, wherein a bottom end of the insulating layer is positioned at a level lower than a top surface of the semiconductor layer; and a bottom end of the semiconductor pillar is positioned above a top surface of the conductive layer.

10. The semiconductor memory device according to claim 1, further comprising:
    a conductor extending along the lateral surface of the stacked body and being in contact with the semiconductor layer;
    the insulating layer being positioned between the stacked body and the conductor.

11. The semiconductor memory device according to claim 10, wherein the conductor is in contact with the first semiconductor region.

12. The semiconductor memory device according to claim 1, wherein the semiconductor layer includes a second semiconductor region of a first conductivity type positioned between the insulating layer and the first semiconductor region.

13. The semiconductor memory device according to claim 12, wherein a concentration of a first conductivity type impurity in the second semiconductor region is higher than a concentration of a first conductivity type impurity in the semiconductor layer.

14. The semiconductor memory device according to claim 1, wherein
    the semiconductor layer includes a first layer and a second layer positioned between the first layer and the conductive layer; and
    a concentration of a first conductivity type impurity in the second layer is higher than a concentration of a first conductivity type impurity in the first layer.

15. The semiconductor memory device according to claim 14, wherein a bottom end of the semiconductor pillar is positioned in the first layer.

* * * * *